(12) United States Patent
Karlsson

(10) Patent No.: US 7,187,242 B2
(45) Date of Patent: Mar. 6, 2007

(54) PLL PHASE/FREQUENCY DETECTOR WITH FULLY DIFFERENTIAL OUTPUT CHARGE PUMP

(75) Inventor: Magnus Karl-Olof Karlsson, Kungsangen (SE)

(73) Assignee: Zarlink Semiconductor AB, Jarfalla (SE)

( * ) Notice: Subject to any disclaimer, the term of this patent is extended or adjusted under 35 U.S.C. 154(b) by 24 days.

(21) Appl. No.: 11/038,353

(22) Filed: Jan. 19, 2005

(65) Prior Publication Data

US 2005/0168291 A1     Aug. 4, 2005

(30) Foreign Application Priority Data

Jan. 23, 2004 (GB) ................... 0401536.8

(51) Int. Cl.
*G05F 3/08* (2006.01)
*H03K 5/1254* (2006.01)

(52) U.S. Cl. .................. 331/17; 327/157; 327/536
(58) Field of Classification Search ............ 327/536, 327/157; 31/17
See application file for complete search history.

(56) References Cited

U.S. PATENT DOCUMENTS

| 6,118,346 | A | 9/2000 | Olgaard |
| 6,229,362 | B1 | 5/2001 | Choi |
| 6,255,873 | B1 * | 7/2001 | Johnson et al. ............. 327/157 |
| 6,265,946 | B1 | 7/2001 | Bartlett |
| 6,429,734 | B1 * | 8/2002 | Wang et al. ................ 327/558 |
| 6,466,097 | B1 * | 10/2002 | Celant et al. ................. 331/17 |
| 6,526,111 | B1 | 2/2003 | Prasad |
| 6,664,829 | B1 | 12/2003 | Hughes |
| 6,847,251 | B2 * | 1/2005 | Kao ........................... 327/536 |
| 2002/0041651 | A1 | 4/2002 | Schwarzmueller |
| 2003/0062958 | A1 | 4/2003 | Ramet et al. |
| 2003/0076141 | A1 | 4/2003 | Hsu et al. |
| 2003/0107420 | A1 | 6/2003 | Hsu et al. |
| 2003/0117189 | A1 | 6/2003 | Beghein |

FOREIGN PATENT DOCUMENTS

| DE | 19617635 A1 | 11/1997 |
| DE | 10163536 A1 | 7/2003 |
| EP | 0718978 A1 | 6/1996 |
| FR | 2754959 | 4/1998 |
| JP | 02013131 | 1/1990 |

OTHER PUBLICATIONS

Da Dalt, Nicola; Sandner, Christoph; "A Subpicosecond Jitter PLL for Clock Generation in 0.12-µm Digital CMOS"; IEEE Journal of Solid State Circuits; Jul. 2003; pp. 1275-1278; vol. 38 No. 7; IEEE Inc.; New York; USA.

\* cited by examiner

*Primary Examiner*—Robert Pascal
*Assistant Examiner*—James Goodley
(74) *Attorney, Agent, or Firm*—Lawrence E. Laubscher, Jr.

(57) ABSTRACT

Charge current in a charge pump of a phase locked loop is equalized by controlling one of the direct current sources with a feedback signal derived from the common mode voltage of a fully differential phase locked loop filter.

18 Claims, 3 Drawing Sheets

PLL PHASE/FREQUENCY DETECTOR WITH FULLY DIFFERENTIAL OUTPUT CHARGE PUMP

FIELD OF INVENTION

This invention relates to the field of phase locked loops (PLLs), and in particular to a method of equalizing charge current in a charge pump of a phase locked loop including a pair of direct current sources.

BACKGROUND OF THE INVENTION

A PLL typically employs a phase detector, loop filter, voltage controlled oscillator (VC)) and feedback loop to generate an output signal from a reference signal. When PLLs are integrated on CMOS integrated circuits with either an on-chip or off-chip loop filter, a fully differential control voltage of the voltage controlled oscillator VCO must be used to avoid noise injection. Otherwise unwanted spurs or degraded phase noise can occur.

Generally, for simplicity, when an off-chip loop filter is used, use is made of a single ended control voltage. While a single-ended control voltage does not degrade performance when an off-chip loop filter is used, when an on chip loop filter is used or when minimized charge pump currents are required this approach cannot be employed.

One possibility is to use a fully differential control voltage approach, as shown in FIG. 1, but this approach is not commonly used since the source and sink current sources used in the charge pump cannot be equal unless an automatic regulation system of common mode voltage control is used because the two current sources in a semiconductor device are never equal due to process variation and other inequalities.

To avoid process variation, switched current sources are commonly used, as shown in FIG. 2. To ensure that the current sources always are saturated, i.e. turned on, two additional switches short the high impedance current sources to a low impedance voltage source that in the single output variant tracks the voltage at the output.

SUMMARY OF THE INVENTION

According to the present invention there is provided a method of equalizing charge current in a charge pump of a phase locked loop including a pair of direct current source comprising providing a fully differential phase locked loop filter; and controlling one of said direct current sources with a feedback signal derived from a common mode voltage of said fully differential phase locked loop filter.

The invention solves a problem related to the fact that two current sources in a semiconductor device are never equal due to process variation and other inequalities. The problem of unequal current sources prevents the use of a fully differential charge pump and loop filter since any difference in the sourcing and sinking current will force the fully differential loop filter, which floats with respect to a ground reference, towards either positive or negative supply, resulting in a degraded performance and higher noise sensitivity.

In a preferred embodiment the invention consists of a phase/frequency detector with non overlapping control signal controlling a fully differential charge pump with active common mode control only connected across loop filter while charging is performed otherwise not. The arrangement does not degrade phase nose and spur performance of the VCO output as other charge pump and common mode control methods do.

The invention relates especially to the control of error free charge injection into the loop filter and the control of common mode voltage of a fully differential, and with respect to ground or reference voltage, floating loop filter. The invention preferably uses a phase noise non degrading common mode control and switch control eliminating erroneous loop filter charge injection.

In another aspect the present invention provides a phase locked loop comprising a phase detector; a fully differential loop filter; a charge pump with a pair of direct current sources for injecting charge into said fully differential filter; and a feedback loop for controlling one of said current sources with a feedback signal derived from a common mode voltage of said fully differential loop filter.

BRIEF DESCRIPTION OF THE DRAWINGS

The invention will now be described in more detail, by way of example only, with reference to the accompanying drawings, in which:—

DETAILED DESCRIPTION OF THE PREFERRED EMBODIMENTS

Figure 1:
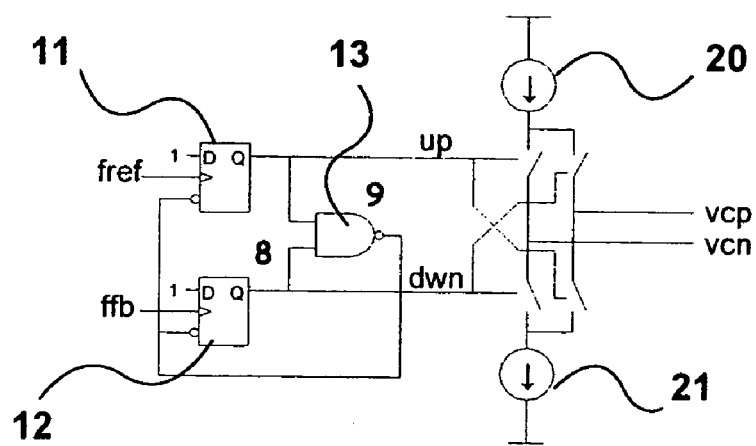
FIG. 1 shows a prior art phase/frequency detector and fully differential output charge pump with switched current sources.
Figure 2:
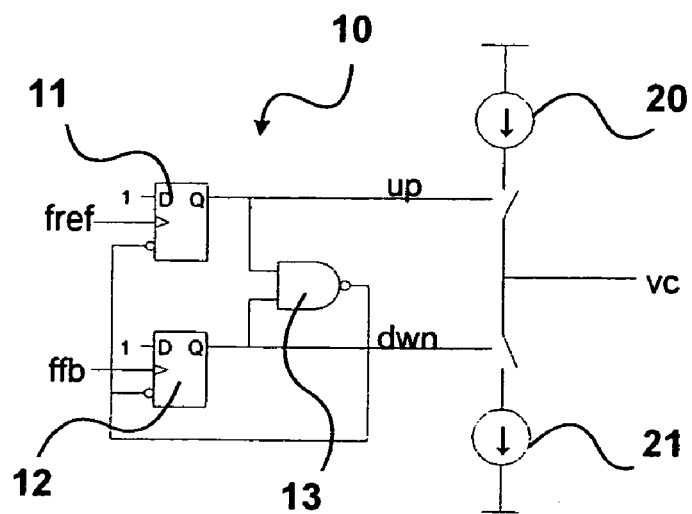
FIG. 2 shows a prior art phase/frequency detector and single output charge pump with switched current sources.

In the drawings like parts are referenced with like reference numerals.

Figure 3:
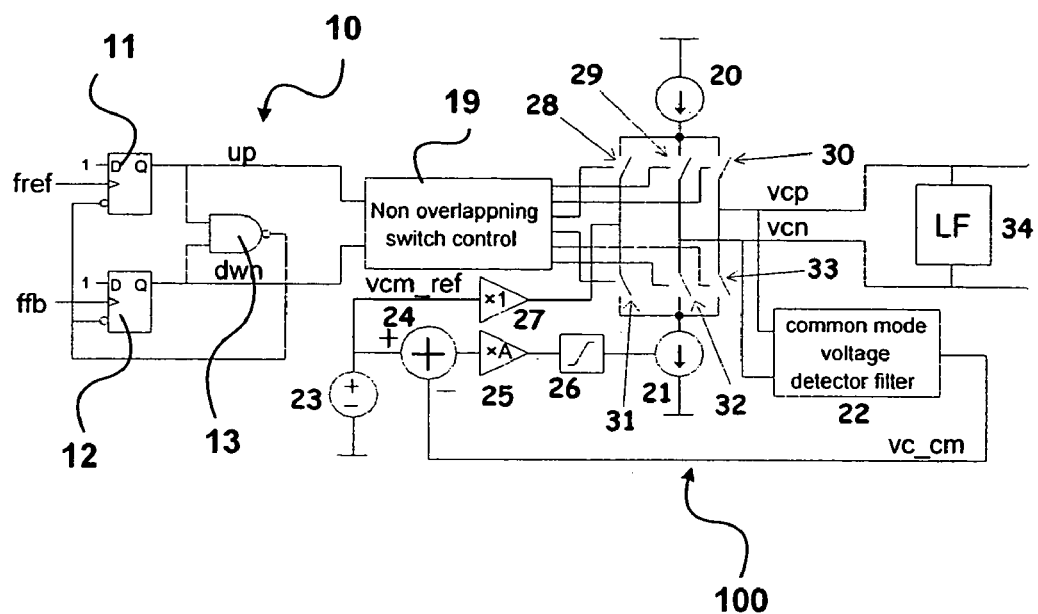
FIG. 3 shows a preferred embodiment of the invention including phase/frequency detector and fully differential output charge pump with non overlap switching current sources, and active, capacitive load only, common mode control.

Referring now to FIG. 3, a preferred embodiment of the inventive method to equalize the positive and the negative charge current sources of a PLL charge pump is shown.

The embodiment comprises a phase detector 10 including a pair of up down counters 11, 17, and a NAND gate 13. A non-overlapping switch controller 19 controls switches 28, 29, 30, 31, 32, 33. The purpose of the non-overlapping scheme is to prevent the fully differential loop filter 34 from being shorted during switching, which can cause erroneous charge injection. The loop filter 34 typically controls a voltage controlled oscillator (not shown).

The PLL has a positive current source 20, which is unregulated and constant. A negative current source 21 is placed in a sampled regulation loop 100 formed by a common mode voltage detector-filter 22, a voltage subtractor 24, an amplifier 25, and a limiter 26.

The regulation loop 100 forces the value of the negative current source 21 such that the common mode voltage of the nodes vcp and vcn equals the common mode reference voltage vcm_ref generated by a voltage source 23.

The set of switches 28–33 performs the operation of switching the current sources either to one of vcp or vcn nodes or to a common node forced to a voltage equal to the common mode reference voltage by a buffer 27 depending on the output of the phase/frequency detector 10.

The purpose of the buffer 27 is to ensure that the current sources 20 and 21 always turn on to eliminate time dependent charging of the fully differential loop filter 34.

The switching operation forces the loop to be a sampled loop. This requires the current regulation loop bandwidth to be much lower than the sampling frequency defined by the frequency of the reference frequency signal. In practice this is not a significant limitation.

Figure 4:
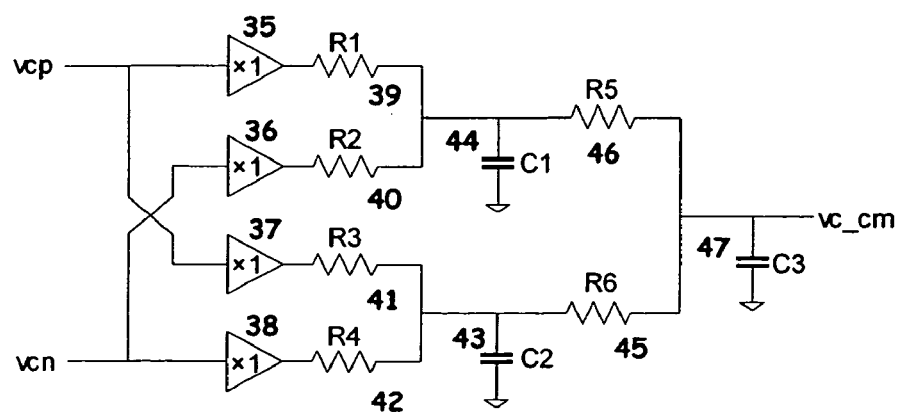
FIG. 4 shows a preferred embodiment of the invention including only the common mode voltage detector filter with buffered inputs and RC network filtered output.

FIG. 4 shows in more detail a preferred embodiment of the common mode voltage detector-filter 22. Four high impedance input buffers 35–38, with the gain of 1, isolate the nodes vcp and vcn from an RC filter network consisting of resistors 39, 40, 41, 42, 45, and 46, and capacitors 43, 44 that performs two tasks, namely:

a) Detecting the common mode voltage $$vcm = \frac{(vcp + vcn)}{2}$$

b) low pass filtering the common mode voltage to remove any differential signal frequency content.

Figure 5:
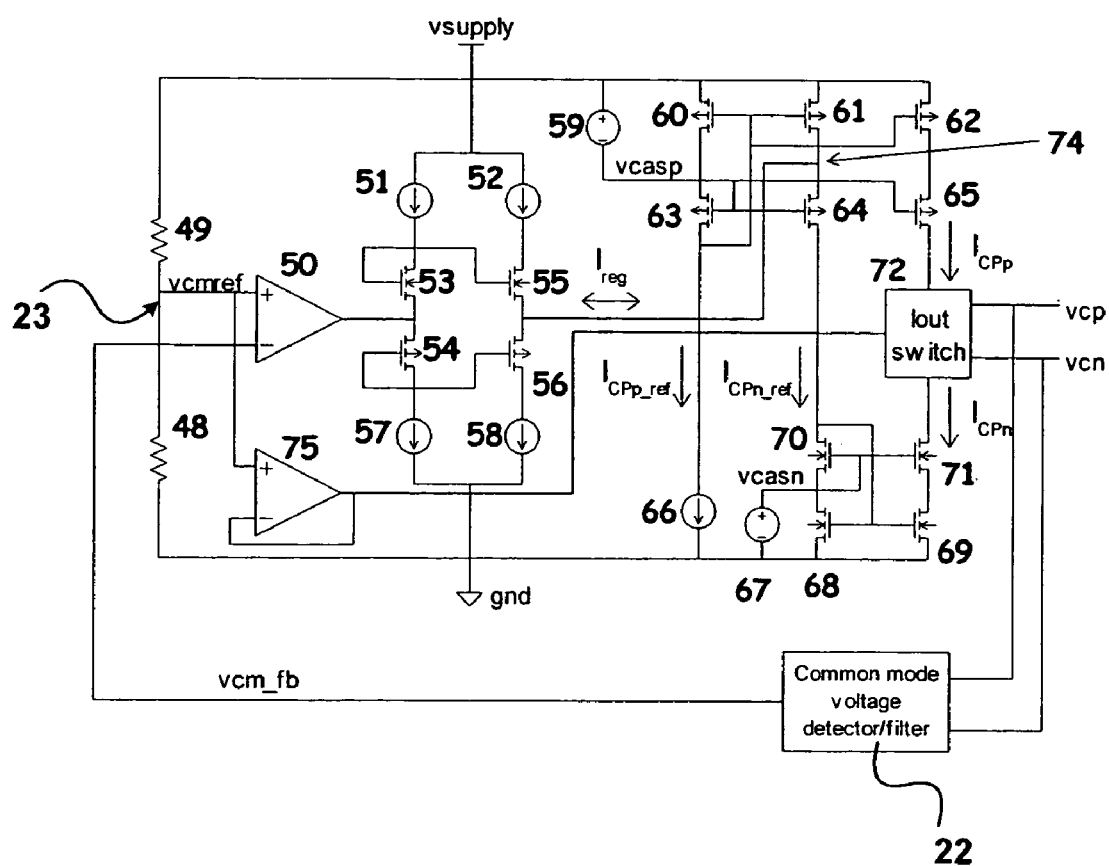
FIG. 5 shows a preferred embodiment of the invention including only the current regulation loop.

In FIG. 5 shows a detailed preferred embodiment of the current regulation loop. Here the reference voltage generator 23 is formed by a resistive divider 48 and 49 which feeds the reference voltage vcm_ref to an operational amplifier, in the following called opamp, configured as a voltage follower 75 and a transconductance operational amplifier 50, hereafter referred to as OTA.

The current regulation loop consists of the common mode voltage detector-filter 22, comprising the preferred embodiment shown in FIG. 4, the OTA, a current limiter circuit 27 comprising four current sources 51, 52, 57 and 58 and four MOS devices 53–56.

Also included in the regulation loop are a current summation point 74 at which the nominal reference current of the negative current source $I_{CPn\_ref0}$ generated by PMOS device 61 and the regulation current $I_{reg}$ are summed resulting in the regulated reference current $I_{CPn\_ref}$. The loop also includes MOS devices 60, 62, 63, 64, 65 68, 69, 70, 71, current source 66, and voltage sources 59, 67.

The regulation loop is closed by the fact that ICPp and ICPn charge the fully differential loop filter 34 where the common mode voltage is detected and filtered by the above named common mode voltage detector-filter 22 from which the output is fed to the opposite input of the above named OTA.

As noted above, in order to eliminate erroneous charging of the loop filter, the switch control signals controlling the current source switches are generated from the phase/frequency detector outputs, up and dwn by a non overlap scheme 19.

I claim:

1. A method of equalizing charge current in a charge pump of a phase locked loop, comprising:
providing a pair of direct current sources including a regulated direct current source;
providing a fully differential phase locked loop filter with first and second inputs;
supplying current from said direct current sources to said first and second inputs through switches under the control of a non-overlapping switching controller responsive to signals from a phase detector;
detecting a common mode voltage of said first and second inputs;
comparing said common mode voltage with a reference voltage; and
controlling said regulated direct current source with a feedback signal derived from the common mode voltage of said first and second inputs to maintain said common mode voltage at a value determined by said reference voltage.

2. A method as claimed in claim 1 wherein said feedback signal is generated by a detector-filter that detects the common mode voltage to remove any differential signal component.

3. A method as claimed in claim 2, wherein said detector-filter is a capacitive loading filter.

4. A method as claimed in claim 1, wherein said non-overlapping switch controller is controlled by control signals are generated from up/down outputs of said phase detector.

5. A method as claimed in claim 1, wherein said feedback signal controls said regulated direct current source to ensure that the value of the common mode control voltage equals said reference voltage.

6. A method as claimed in claim 5, wherein said reference voltage is provided by a resistive divider.

7. A method as claimed in claim 1, wherein a feedback loop generating said feedback signal operates at a sampling frequency determined by a reference frequency signal and the bandwidth of said feedback loop is lower than said sampling frequency.

8. A phase locked loop comprising:
a phase detector;
a fully differential loop filter with first and second inputs;
a charge pump with a pair of direct current sources including a regulated direct current source for injecting charge into said fully differential loop filter;
switches for selectively connecting said direct current sources to said first and second inputs;
a non-overlapping switching controller for controlling said switches in response to an output of said phase detector;
a common mode voltage detector for detecting the common mode voltage of said first and second inputs;
a reference voltage source;
a feedback loop including a subtractor for generating a feedback signal based on a difference between the common mode voltage and the reference voltage; and
said regulated direct current source having an input responsive to said feedback signal to control said regulated current source such that the common mode voltage is maintained at a value determined by said reference voltage.

9. A phase locked loop as claimed in claim 8, wherein said feedback signal controls said regulated direct current source so that said common mode voltage is equal to said reference voltage.

10. A phase locked loop as claimed in claim 9, wherein said feedback loop includes a feedback filter coupled to said first and second inputs.

11. A phase locked loop as claimed in claim 10, wherein said feedback filter is fully capacitive.

12. A phase locked loop as claimed in claim 10, wherein said feedback filter comprises a network of resistors and capacitors.

13. A phase locked loop as claimed in claim 12, wherein said feedback filter further comprises high impedance input buffers to isolate the fully differential amplifier from said network of resistors and capacitors.

14. A phase locked loop as claimed in claim 9, wherein said voltage reference source is a resistive voltage divider.

15. A phase locked loop as claimed in claim 10, wherein said feedback loop further includes a current limiter.

16. A phase locked loop as claimed in claim 15, wherein said current limiter includes a network of current sources and MOS devices.

17. A phase locked loop as claimed in claim 16, wherein said feedback loop includes a transconductance amplifier receiving the reference voltage from said resistive voltage divider.

18. A phase locked loop as claimed in claim 8, wherein said loop filter includes a buffer to ensure that the direct current sources always turn on to eliminate time dependent charging of the fully differential loop filter.

* * * * *